(12) United States Patent
Anderson et al.

(10) Patent No.: US 6,908,781 B2
(45) Date of Patent: Jun. 21, 2005

(54) METHOD AND APPARATUS FOR PROTECTING WIRING AND INTEGRATED CIRCUIT DEVICE

(75) Inventors: Robert L. Anderson, Boulder, CO (US); David Reyes, Superior, CO (US)

(73) Assignee: PTS Corporation, Santa Clara, CA (US)

(*) Notice: Subject to any disclaimer, the term of this patent is extended or adjusted under 35 U.S.C. 154(b) by 49 days.

(21) Appl. No.: 10/828,486

(22) Filed: Apr. 19, 2004

(65) Prior Publication Data

US 2004/0196608 A1 Oct. 7, 2004

Related U.S. Application Data

(62) Division of application No. 10/216,600, filed on Aug. 9, 2002, now Pat. No. 6,809,384.

(51) Int. Cl.[7] .......................... H01L 21/00; H01L 21/31
(52) U.S. Cl. ........................... 438/50; 438/53; 438/758
(58) Field of Search ............................ 438/50, 53, 758

(56) References Cited

U.S. PATENT DOCUMENTS

| 5,212,582 | A | 5/1993 | Nelson |
|---|---|---|---|
| 5,600,383 | A | 2/1997 | Hornbeck |
| 5,847,381 | A | 12/1998 | Isogai |
| 5,960,133 | A | 9/1999 | Tomlinson |
| 6,028,689 | A | 2/2000 | Michalicek et al. |
| 6,040,935 | A | 3/2000 | Michalicek |
| 6,128,122 | A | 10/2000 | Drake et al. |
| 6,140,144 | A | 10/2000 | Najafi et al. |
| 6,232,150 | B1 | 5/2001 | Lin et al. |
| 6,307,657 | B1 | 10/2001 | Ford |
| 6,346,189 | B1 | 2/2002 | Dai et al. |
| 6,352,933 | B1 | 3/2002 | Forbes et al. |
| 6,437,432 | B2 | 8/2002 | Ikumo et al. |
| 6,469,330 | B1 | 10/2002 | Vigna et al. |
| 6,747,340 | B2 | 6/2004 | Barnes et al. |
| 6,808,384 | B1 * | 10/2004 | Jordan et al. ............... 425/432 |
| 2001/0021570 | A1 | 9/2001 | Lin et al. |
| 2003/0173112 | A1 | 9/2003 | Barnes et al. |
| 2003/0174929 | A1 * | 9/2003 | Rodgers et al. ............... 385/18 |

OTHER PUBLICATIONS

Akiyama, Terunobu et al., Controlled Stepwise Motion in Polysilicon Microstrucures, Journal of Microelectromechanical Systems, vol. 2, No. 1, Sep. 1993, pp 106–110.

Ashruf, C.M.A. et al., Galvanic Porous Silicon Formation Without External Contracts, Elsevier Science S.A., Sensors and Actuators 74 (1999), pp . . . 118–122.

Bean, Kenneth E., Anisotropic Etching of Silicon, IEEE Transactions on Electron Devices, vol. ED–25, No. 10, Oct. 1978, pp 1185–1193.

Ciarlo, Dino R., A Latching Accelerometer Fabricated by the Anisotropic Etching of (110) Oriented Silicon Wafers, 0860–1317/92/010010+04104.50, Mar. 1992 IOP Publishing Ltd.

(Continued)

*Primary Examiner*—Alexander Ghyka
(74) *Attorney, Agent, or Firm*—Townsend and Townsend and Crew LLP

(57) ABSTRACT

A method and apparatus for protecting a conductor in an integrated circuit. A protective covering can be disposed over a conductor for a substantial length along the conductor while allowing a portion of the conductor to be exposed. The protective covering can be configured as a tunnel which runs for a substantial length along the conductor and can be operable to prevent the occurrence of electrical shorts during operation of the integrated circuit. According to one embodiment of the invention the integrated circuit can be configured as a micromachined device with active mechanical components exposed to the atmosphere.

49 Claims, 18 Drawing Sheets

OTHER PUBLICATIONS

Dewa, Andrews S., et al., Development of a Silicon Two–Axis Micromirror for an Optical Cross–Connect, Solid–State Sensor and Actuator Workshop, Hilton Head Island, South Carolina, Jun. 4–6, 2000, pp. 93–96.

Ford, Joseph E. et al., Wavelength Add–Drop Switching Using Tilting Micromirrors, Journal of Lightwave Technology, vol. 17, No. 5, May 1999, pp. 904–911.

Grade, John D., et al., A Large–Deflection Electrostatic Actuator for Optical Switching Applications, Solid–State Sensor and Actuator Workshop, Hilton Head Island, South Carolina, Jun. 4–6, 2000, pp. 97–100.

Hopkins, Robert E., Some Thoughts on Lens Mounting, Optical Engineering, vol. 15, No. 5, Sep.–Oct. 1976, pp. 428–430.

Kaajakari, Ville, et al., Ultrasonic Actuation for MEMS Dormancy–Related Stiction Reduction, In MEMS Reliability for Critical Applications, Proceedings of SPIE vol. 4180, 2000, pp. 60–65.

Koch, T.L. et al., Anisotropically Etched Deep Gratings for InP/InGaAsP Optical Devices, Journal of Applied Physics B2 (8), Oct. 15, 1987, pp. 3461–3463.

Schilling, M. et al., Deformation–Free Overgrowth of Reactive Ion Beam Etched Submicron Structures in InP by Liquid Phase Epitaxy, Applied Physics Lett. 49 (12), Sep. 22, 1986, pp. 710–712.

Tang, William C., et al., Electrostatically Balanced Comb Drive for Controlled Levitation, Reprinted from Technical Digest IEEE Solid–State Sensor and Actuator Workshop, Jun. 1990, pp. 198–202.

Torcheux, L. et al., Electrochemical Coupling Effects on the Corrosion of Silicon Samples in HF Solutions, J. Electrochem. Soc., vol. 142, No. 6, Jun. 1995, pp. 2037–2046.

Van Kessel, Peter F. et al., A MEMS–Based Projection Display, Proceedings of the IEEE, vol. 86, No. 8, Aug. 1998, pp. 1687–1704.

Keller, Christopher, Microfabricated Silicon High Aspect Ratio Flextures for In–Plane Motion, Dissertation submitted to University of California, Berkeley, Fall 1998.

Muller, Lilac, Gimballed Electrostatic Microactuators with Embedded Interconnects, Dissertation submitted to University of California, Berkeley, Spring 2000.

* cited by examiner

FIG. 6      600

METHOD AND APPARATUS FOR PROTECTING WIRING AND INTEGRATED CIRCUIT DEVICE

CROSS-REFERENCES TO RELATED APPLICATIONS

This application is a divisional application of U.S. Ser. No. 10/216,600 filed Aug. 9, 2002, which is now U.S. Pat. No. 6,809,384.

STATEMENT AS TO RIGHTS TO INVENTIONS MADE UNDER FEDERALLY SPONSORED RESEARCH OR DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

The following embodiments of the invention relate generally to integrated circuits. More particularly, these embodiments relate to micromachined (MEMS) devices.

BACKGROUND

In integrated circuits, it is common to provide various layers of material so as to fabricate the integrated circuit. This process is completed by depositing a passivation layer so as to protect the earlier deposited layers of materials. Furthermore, it is common to cap the integrated circuits with a plastic material to prevent their destruction. One type of integrated circuit, however, does not allow for such a passivation layer to be applied in view of the fact that the integrated circuit is comprised of an active mechanical component.

For example, in the field of micromachined (MEMS) devices, it is common to provide an active mechanical component, such as a mirror, that needs to be exposed to the atmosphere. In the case of a MEMS device that is comprised of mirrors, the mirrors need to be capable of receiving light transmission signals so that these transmission signals can be properly routed by reflection from the mirrors. Similarly, other components, for example, allow refraction or diffraction of various optical signals. These are merely examples, as MEMS devices can be comprised of other active mechanical components. Such MEMS devices make packaging of the integrated circuit components difficult in view of the fact that a passivation layer cannot be applied to the entire circuit when such active mechanical components must be free to move and receive signals.

One aspect of fabrication of integrated circuits is the deposition of material so as to form conductors that carry electrical signals throughout the integrated circuit. This is normally accomplished by depositing a conductive material that is suitable for conducting the particular electrical signal throughout the integrated circuit. One such conductive material is polysilicon which is conductive for purposes of transmitting digital signals in integrated circuits. Under normal circumstances, when a traditional integrated circuit is being fabricated, such a conductive material would be encapsulated by other materials and possibly a passivation layer so as to protect the conducting material from being exposed to extraneous particles which often occur as part of the fabrication process. In the manufacture of MEMS devices, however, the use of such encapsulating materials is not always possible, because the active mechanical components cannot be encapsulated without destroying their function. Thus, in packaging MEMS devices, it is sometimes necessary to deposit conductors which are exposed to the atmosphere and as a result can easily be shorted by the random particles which exist.

For example, such random particles can occur merely as dirt particles that exist in the atmosphere in which the integrated circuit is manufactured. Typically, such particles are filtered out of the processing environment through the use of stringent filtering controls; however, such filtering does not always catch every particle. Thus, some particles still make it though the filtering process and are capable of shorting out exposed conductors.

More typical, however, is that the manufacturing process itself results in fragments of silicon that are not completely removed during the various fabrication steps of a MEMS device. For example, the fabrication process is typically accomplished using deposition of successive layers of material along with intermediate removal of portions of these layers of material. Where these layers meet, it is typical to get fragments of material from the edges where other material has been removed. Silicon is very brittle, and therefore pieces of silicon at the edges where the layers of material meet can easily flake away resulting in free particles that drift to other portions of the circuit. These free particles are unintended; however, they are not that uncommon. Sometimes, these particles are referred to as "stringers". Furthermore, stringers can result from sacrificial particles that are released during the fabrication process yet not entirely removed by a step of that process. For example, sometimes material can be intended to be etched away, yet merely broken free without removal from the integrated circuit. Therefore, this can result in the stringer being free to migrate to other portions of the circuit.

As a result of the presence of inherent dirt and stringers, these particles can cause the shorting out of a conductor during operation of the integrated circuit. MEMS devices are often different from the typical integrated circuit. Namely, MEMS devices often operate at very high voltages with a high density of exposed conductors in a given unit of the area of the circuit. In contrast, a typical integrated circuit, such as a memory device, often operates at very low voltages with conductors that are insulated from one another. Furthermore, such typical insulated integrated circuit devices usually do not have exposed wiring in the density that is common in MEMS devices. As a result, MEMS devices can be prone to shorting out as a result of the high voltages that exist and the proximity of exposed conductors operating at such a high potential difference. For example, such voltages can be in the hundreds of volts as compared to the five (5) volt signals, for example, used in some standard integrated circuit memory devices.

Thus, there is a desire for a technique that would provide a reduction in the occurrence of damage to MEMS devices which is brought about, for example, by electrical shorting.

SUMMARY

One embodiment of the invention provides a method and apparatus for reducing the occurrence of damage caused by extraneous particles in integrated circuits. According to this embodiment of the invention, a substrate is provided for a micromachined device; a conductor is provided as part of the micromachined device for use in conducting electrical signals during operation of the micromachined device; and, a protective covering is provided for the conductor so that the conductor is disposed between the substrate and protective covering.

According to another embodiment of the invention, a micromachined apparatus can be fabricated comprising a substrate; a bonding pad; a conductor disposed over the substrate; wherein the conductor is electrically coupled with the bonding pad; an active mechanical component disposed over the substrate, wherein the active mechanical component is configured to move relative to the substrate; and a protective cover disposed over the conductor so that the conductor is disposed between the protective cover and the substrate.

According to another embodiment of the invention, a protective covering can be configured for a conductor by depositing a layer of material over the conductor so as to form a tunnel at least partially around the conductor. Thus the majority of the conductor can be protected from electrical shorts through the use of the tunnel which covers the majority length of the conductor.

According to another embodiment of the invention, a ground ring can be established about a conductor. Such a ground ring can be accomplished by electrically coupling a conductive material with the substrate of the circuit so as to provide an equipotential material as a protective cover for the conductor. Thus, for example, the equipotential surface can serve to isolate the conductor from stringers which migrate throughout the circuit.

Further embodiments of the invention will be apparent to those of ordinary skill in the art from a consideration of the following description taken in conjunction with the accompanying drawings, wherein certain methods, apparatuses, and articles of manufacture for practicing the embodiments of the invention are illustrated. However, it is to be understood that the invention is not limited to the details disclosed but includes all such variations and modifications as fall within the spirit of the invention and the scope of the appended claims.

DESCRIPTION

Figure 1:
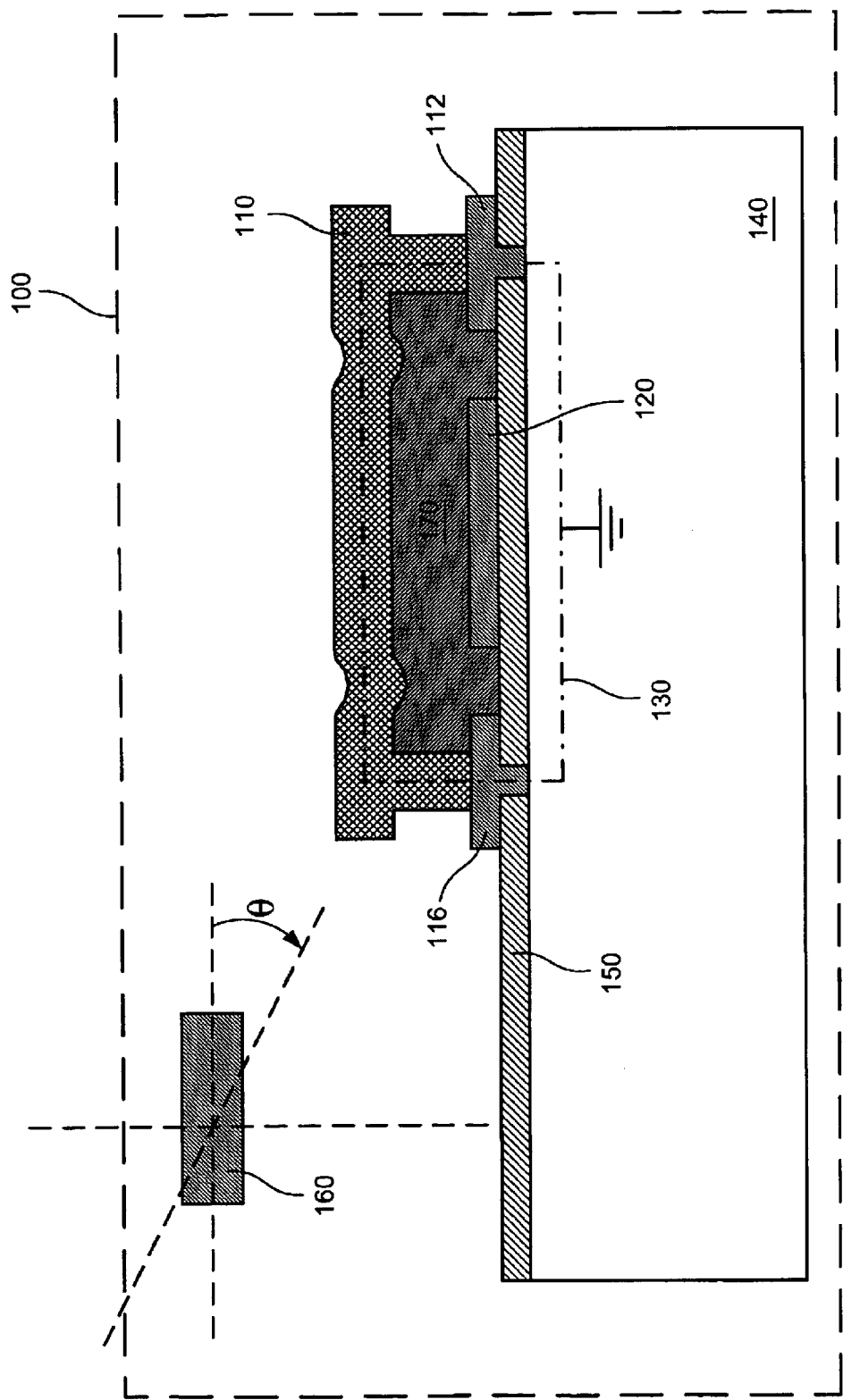
FIG. 1 is a cross-sectional view of a micromachined device according to one embodiment of the invention.

FIG. 1 illustrates a cross-sectional view of an integrated circuit according to one embodiment of the invention. FIG. 1 shows a micromachined device 100 having a substrate 140 manufactured, e.g., from silicon. In FIG. 1, a nitride layer of material is shown deposited directly over the silicon layer 140. This nitride layer serves as an electrical insulator, while the silicon serves as a conductor. Furthermore, FIG. 1 shows a cross-sectional view of a conductor 120 deposited on the nitride layer. This conductor is suitable for conducting electrical signals in the integrated circuit. For example, such conductors are used for conducting electrical signals from a bonding pad of the chip to the input of an active mechanical component on a MEMS device. The cross-sectional view of FIG. 1 also shows a protective covering 110 erected around the conductor 120. In FIG. 1, this protective covering is fabricated from polysilicon, which serves as an electrical conductor. The active mechanical component of micromachined device 100 is shown as block 160 in FIG. 1. For example, this active mechanical component can be a mirror which reflects optical signals received from a fiber optic cable. Other active mechanical components could include but are not limited to, devices which diffract or refract optical signals. The active mechanical component shown in FIG. 1 is shown as being capable of moving through angle theta ($\theta$). Thus, this active component is capable of moving relative to the fixed substrate 140 when the integrated circuit is placed in operation. The dashed lines intersecting in device 160 in FIG. 1 illustrate the position of the active mechanical component relative to the substrate and the exemplary movement of the active mechanical component shown in FIG. 1. Of course, other movements could be accomplished as well. As one of ordinary skill in the art would appreciate, the positioning of a mirror, for example, can be produced by layering of additional material between the nitride layer 150 and the active mechanical component 160. For purposes of clarity, these layers are not shown in FIG. 1.

While FIG. 1 illustrates a cross-sectional view of the integrated circuit, it is understood that the protective covering 110 need not extend along the entire length of conductor 120. Rather the protective covering can be configured so as to extend along a substantial portion, such as 50% or more, or even 70%, 90% or 95% of the length of the conductor.

FIG. 1 also illustrates a ground ring established by the protective covering 110 and substrate 140. In view of the fact that the protective covering sits on blocks of conductive material 112 and 116 which are electrically coupled with the silicon layer in FIG. 1, an equipotential circuit is established around the conductor 120. Thus, any fragment of loose material falling on protective cover 110 would be exposed to the ground voltage reference during operation of the integrated circuit. Furthermore, the only voltage to which the conductor would be exposed when surrounded by the ground ring would be the ground voltage. In addition, surrounding a conductor by the ground ring can help to reduce the effect of electrical noise, such as electromagnetic interference, on the signal carried by the conductor. FIG. 1 also illustrates that the conductor is adjacent material 170. This material could be an insulating material (such as silicon dioxide) or alternatively, if the oxide material is released as part of the fabrication process through the use of hydrofluoric acid (HF), for example, then the material 170 would simply be the atmosphere in which the integrated circuit is operating.

Figure 2:
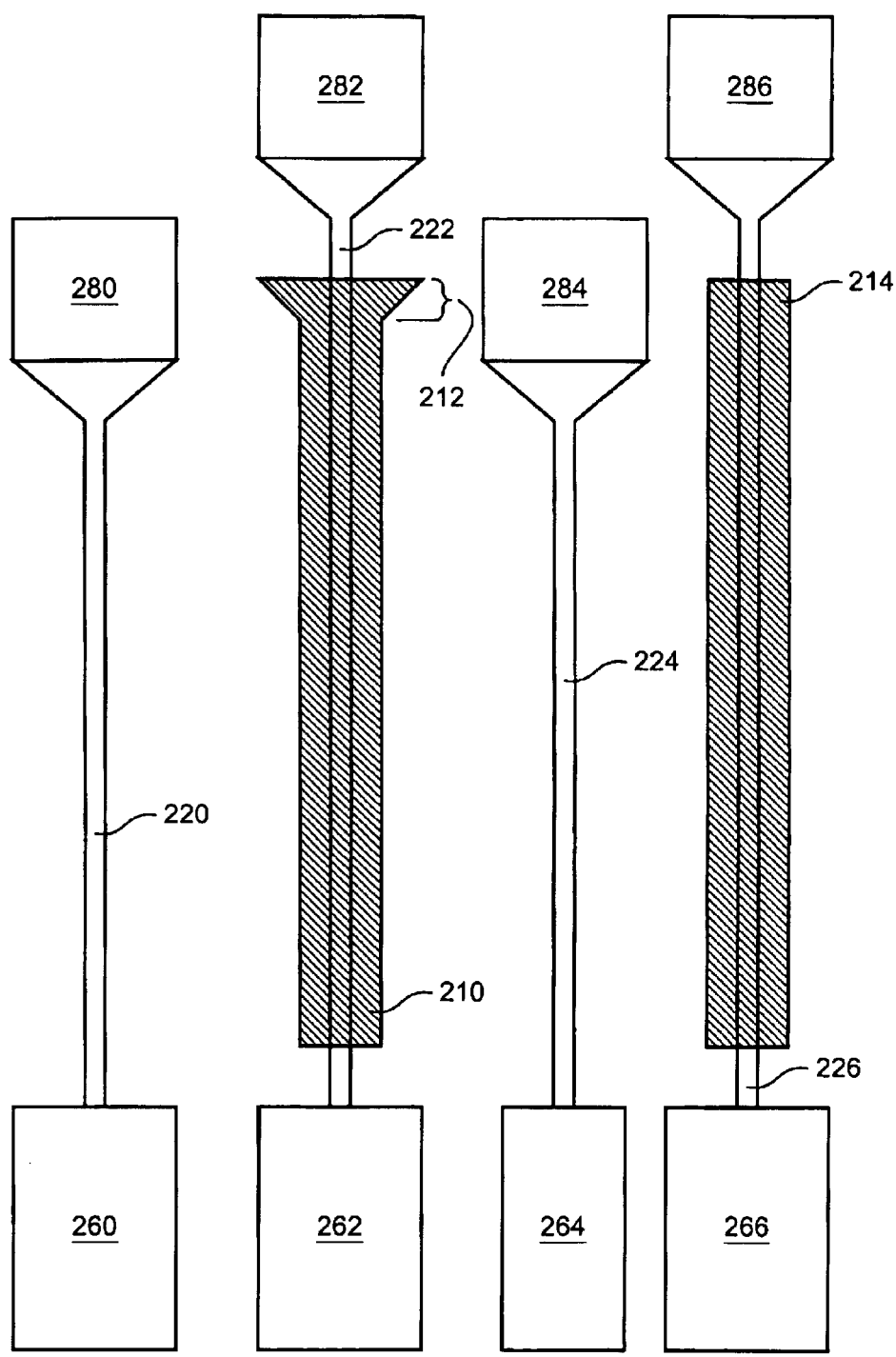
FIG. 2 is a plan view of a micromachined device showing bonding pads and active mechanical components, as well as conductors covered by protective layers and conductors having exposed material, according to one embodiment of the invention.

FIG. 2 illustrates a plan view of an integrated circuit which exemplifies various embodiments of the invention. In FIG. 2, bonding pads 280, 282, 284, and 286 are shown. Bonding pad 280 is electrically coupled with conductor 220 which in turn is electrically coupled to an active mechanical device 260. Similarly, bonding pad 282 is electrically coupled with conductor 222 which in turn is electrically coupled with active mechanical device 262. Conductor 222 is protected by protective covering 210. In addition, bonding pad 284 is coupled to active mechanical device 264 by exposed conductor 224. Similarly, bonding pad 286 is coupled to active mechanical device 266 by a protected conductor 226. The protective coverings 210 and 214 shown in FIG. 2 illustrate alternative ways of configuring a protective covering for a conductor. Namely, the protective covering for conductor 226 illustrates a squared off end to the protective covering. In contrast, the protective covering 210 illustrates a flared or funneled end to the protective covering 210. This flare is illustrated as the angled portion 212 of the protective covering 210 in FIG. 2. By flaring the end of the protective covering, the walls of the protective covering can be extended away from the exposed conductor. Thus, a stringer which lands on the integrated circuit is less likely to short out the exposed portion of material in view of the fact that it must be long enough to reach the flared wall and the exposed conductor. By widening the distance that the stringer must travel between the exposed conductor and the wall of the protective covering, the likelihood of shorting the circuit is reduced. Similarly, the height of the protective covering relative to the conductor could be increased at the end of a protective material layer so as to accomplish the same purpose in the perpendicular direction. Thus, a general funneling of the end of each protective covering would reduce the likelihood of shorts occurring where the protective covering ends and exposed conductors occur. Alternatively, the protective covering can simply be squared off as shown by protective covering 214 and the cross-sectional view of FIG. 1. This is perhaps a more straightforward and easier way to deposit material as a protective covering. FIG. 2, as a plan view, also illustrates that the protective covering can cover a substantial portion of an exposed conductor. Similarly, FIG. 2 illustrates that protective coverings could be fabricated for alternative conductors, rather than all conductors. The conductors shown in FIG. 2 are merely exemplary. It is envisioned that many conductors will not travel in straight lines directly from a bonding pad to the active device.

Figure 3:
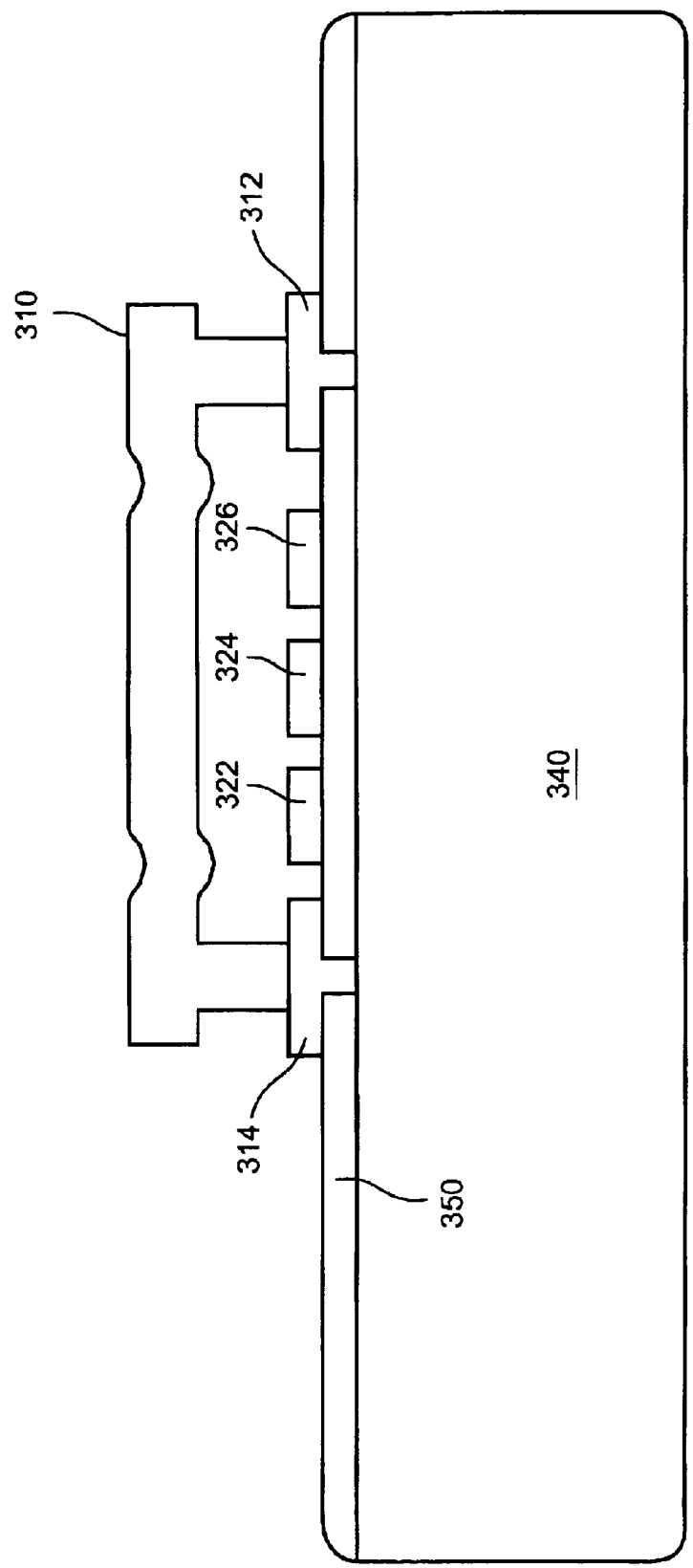
FIG. 3 is a cross-sectional view of an integrated circuit showing a protective layer of material covering more that one conductor according to one embodiment of the invention.

FIG. 3 illustrates a cross-sectional view of an integrated circuit according to another embodiment of the invention. In FIG. 3, a protective covering 310 is used to cover more than one conductor, namely conductors 322, 324, and 326. Thus, in FIG. 3 the protective covering 310 can be utilized to protect more than one conductor. In the example of FIG. 3, a substrate 340 is covered with insulator material 350. The protective covering is coupled to the substrate 340 through deposited material 312 and 314. Thus, protective covering material could be polysilicon which is coupled to a silicon substrate. The insulator material could be nitride or a nitride oxide combination. The intermediate material which couples the protective covering to the substrate could be a polysilicon or metal which can similarly be used for the conductors being protected.

Figure 4:
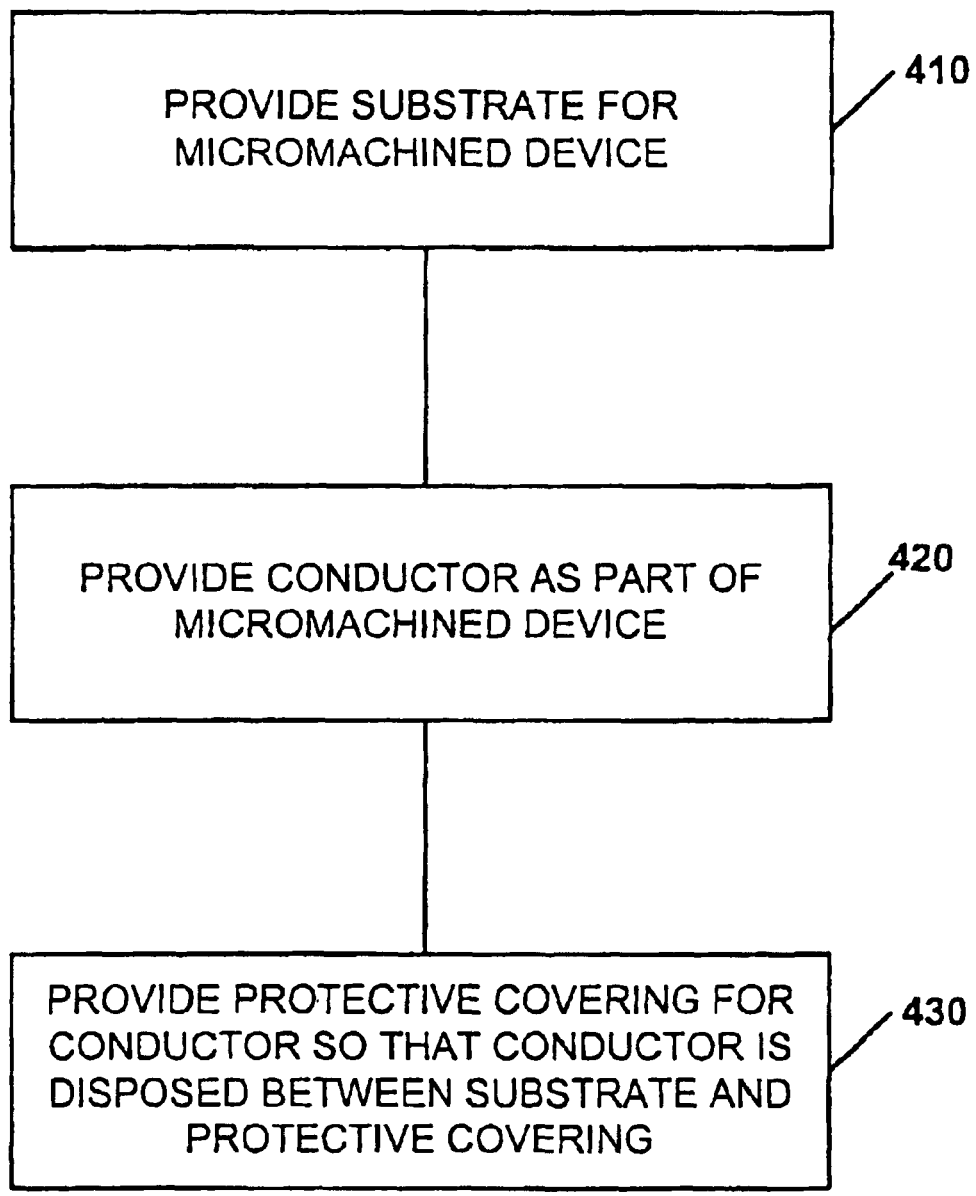
FIG. 4 is a flowchart illustrating a method of providing a micromachined device according to one embodiment of the invention.

FIG. 4 illustrates a flowchart 400 for implementing a method according to one embodiment of the invention. In block 410, a substrate is provided for a micromachined device. In block 420, a conductor is provided as part of the micromachined device. In block 430 a protective covering is provided for the conductor so that the conductor is disposed between the substrate and the protective covering.

Figure 5:
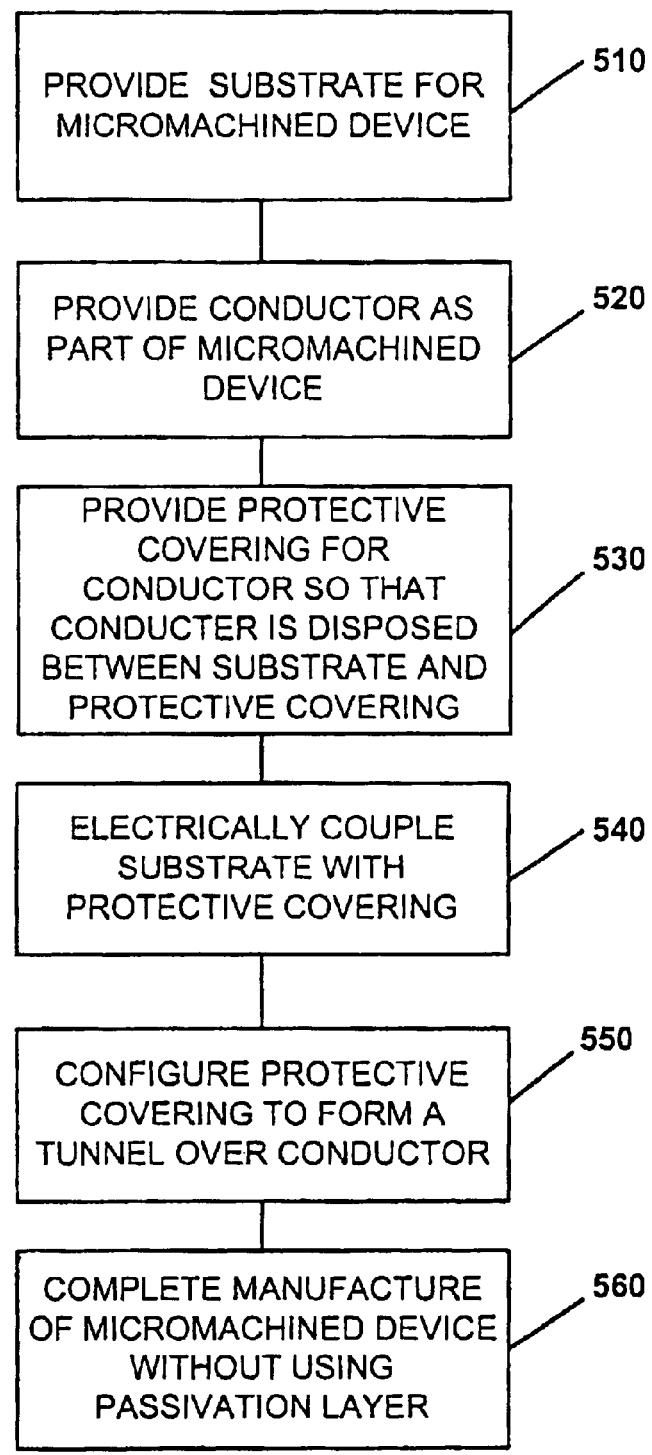
FIG. 5 is a flowchart illustrating a method of providing a micromachined device according to one embodiment of the invention.

In FIG. 5., flowchart 500 illustrates a method according to another embodiment of the invention. In block 510, a substrate is provided for a micromachined device. In block 520, a conductor is provided as part of the micromachined device. In block 530, a protective covering is provided for the conductor so that the conductor is disposed between the substrate and the protective covering. In block 540, the substrate is electrically coupled with the protective covering. In block 550, the protective covering is configured so as to form a tunnel over the conductor. In block 560, the manufacture of the micromachined device is completed without using a passivation layer over the previously deposited layers of material.

Figure 6:
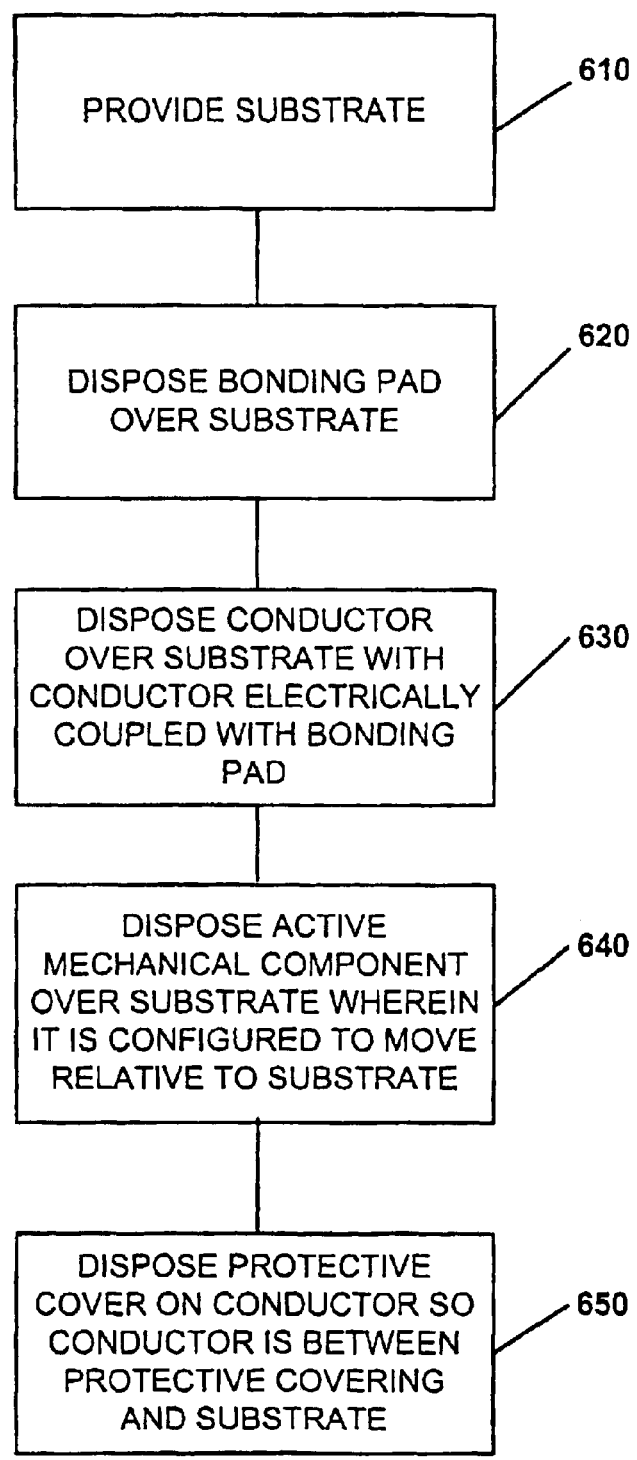
FIG. 6 is a flowchart illustrating a method of providing an integrated circuit according to one embodiment of the invention.

FIG. 6 illustrates a flowchart 600 which describes a method of protecting a conductor in an integrated circuit according to one embodiment of the invention. In block 610 of FIG. 6, a substrate is provided. Block 620 shows that a bonding pad is disposed over the substrate, while block 630 shows that a conductor is disposed over the substrate with the conductor being electrically coupled with the bonding pad. Block 640 illustrates that an active mechanical component is disposed over the substrate wherein the active mechanical component is configured to move relative to the substrate. In block 650, a protective cover is disposed over the conductor so that the conductor is disposed between the protective covering and the substrate.

Figure 7:
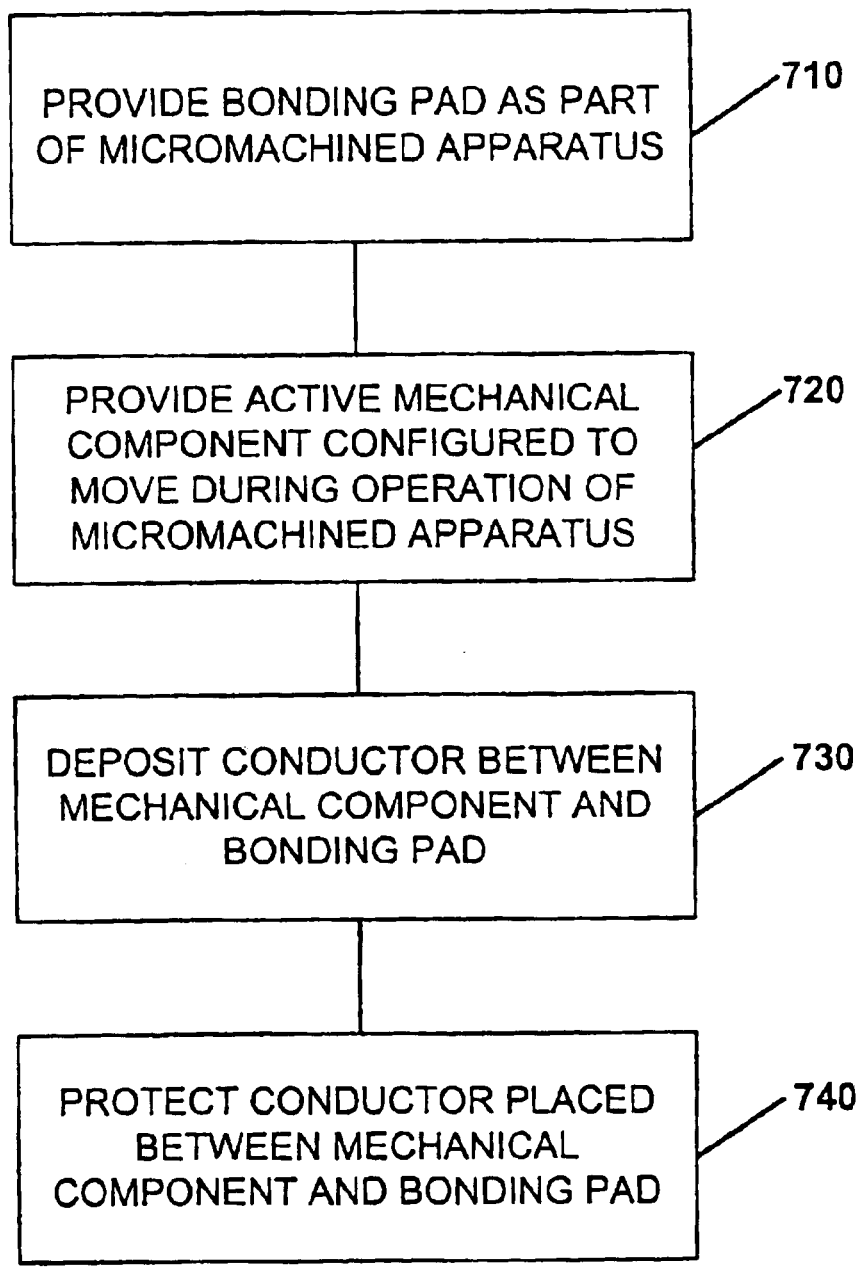
FIG. 7 is a flowchart illustrating a method of providing an integrated circuit according to one embodiment of the invention.

FIG. 7 illustrates a flowchart 700 which describes a method according to another embodiment of the invention. In FIG. 7, block 710 shows that a bonding pad is provided as part of a micromachined apparatus. An active mechanical component is provided and configured to move during operation of the micromachined apparatus according to block 720. In block 730, a conductor is deposited between the active mechanical component and the bonding pad. In block 740, the conductor placed between the mechanical component and the bonding pad is protected.

Figure 8:
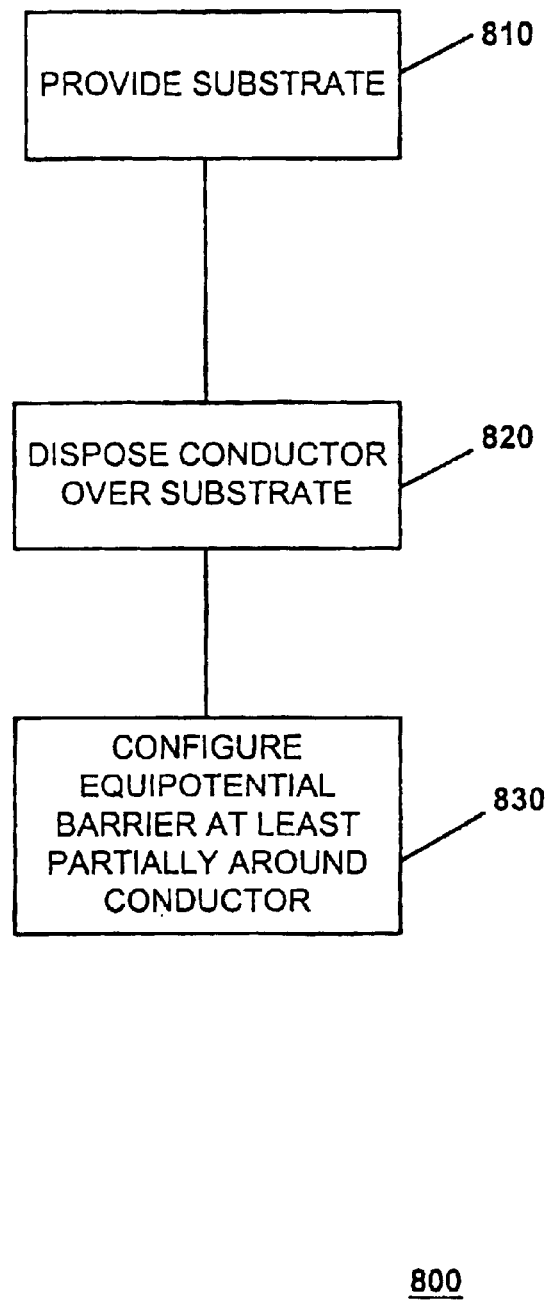
FIG. 8 is a flowchart illustrating a method of configuring an equipotential barrier over a conductor according to one embodiment of the invention.

FIG. 8 illustrates an embodiment of the invention for providing an equipotential barrier for a conductor in an integrated circuit. Namely, in block 810 a substrate is provided. As shown in block 820, a conductor is disposed over the substrate. And, in block 830, an equipotential barrier is configured to extend at least partially around the conductor.

By depositing the protective material so as to cover a substantial portion of the conductor, the conductor can be protected from electrical shorts without the need for depositing a passivation layer. Thus, the fabrication of micromachined devices can be accomplished without the act of depositing a passivation layer of material over the other previously deposited layers of material used to manufacture the integrated circuits.

Figure 9:
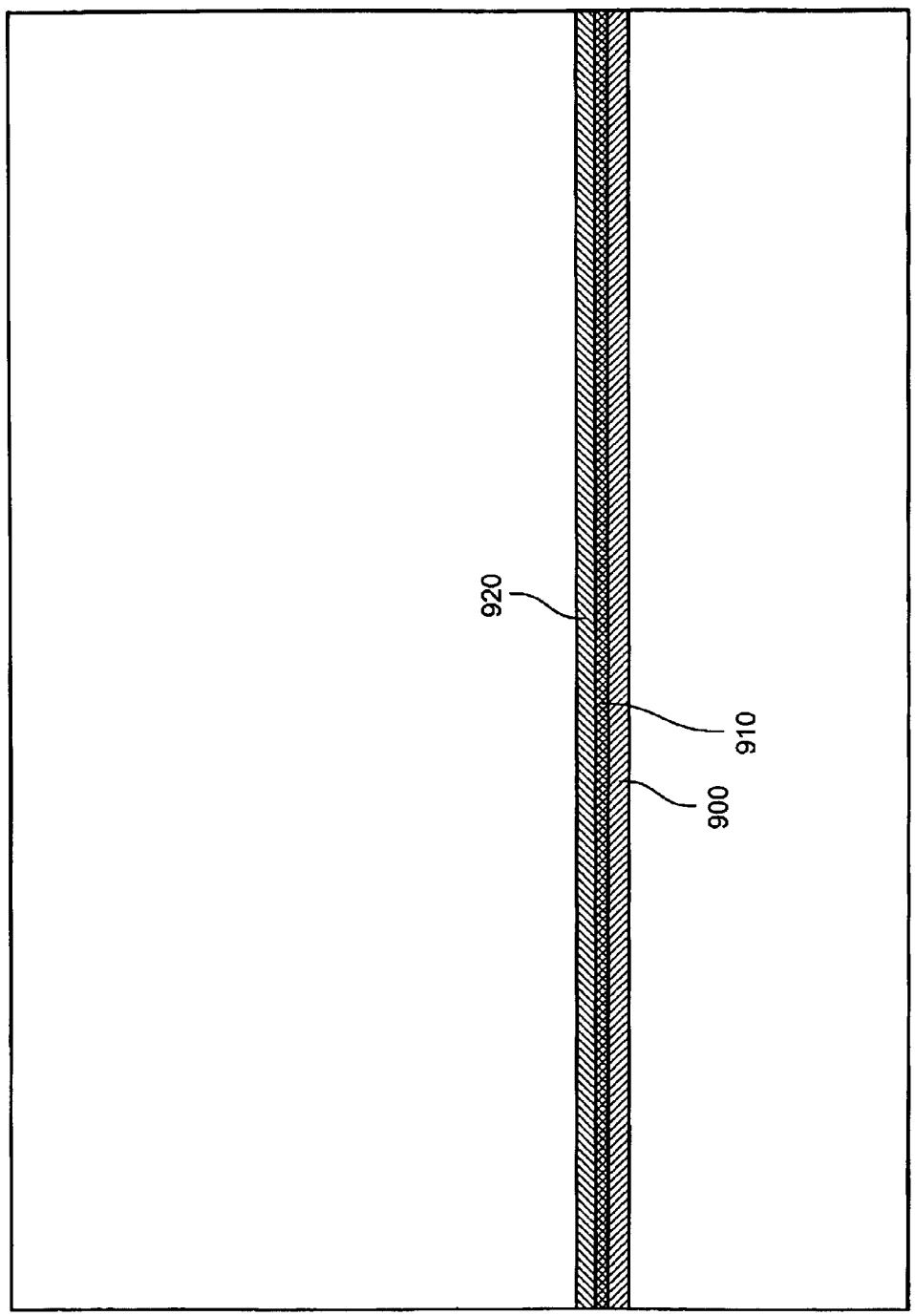
FIG. 9 is a cross-sectional view of the manufacturing process of an integrated circuit according to one embodiment of the invention.

FIGS. 9 through 18 illustrate the process of fabricating a protective layer for a conductor according to one embodiment of the invention. In FIG. 9, a substrate of silicon 900 is shown. On top of this layer of silicon, an oxide, such as silicon dioxide 910 is shown as having been deposited. Furthermore, a nitride layer 920 is shown as having been deposited. The nitride oxide layers form a nitride oxide stack. Thus, the silicon substrate has the property of being an electrical conductor, whereas the nitride oxide layers serve as an electrical insulator.

Figure 10:
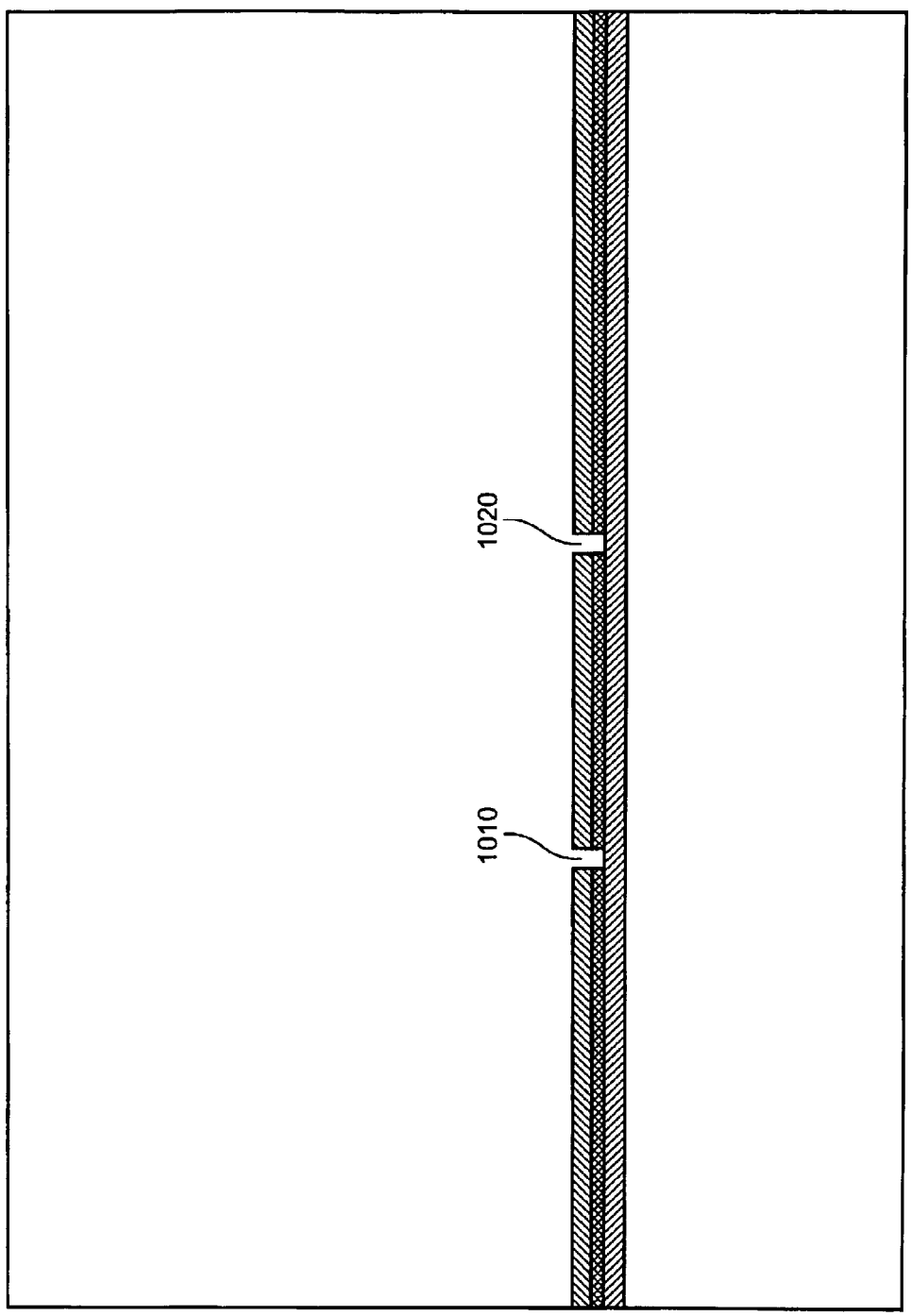
FIG. 10 is a cross-sectional view of the manufacturing process of an integrated circuit according to one embodiment of the invention.

FIG. 10 illustrates that a mask can be used to create channels 1010 and 1020 in the nitride oxide layers. The mask used to accomplish this is shown at the top of FIG. 10.

Figure 11:
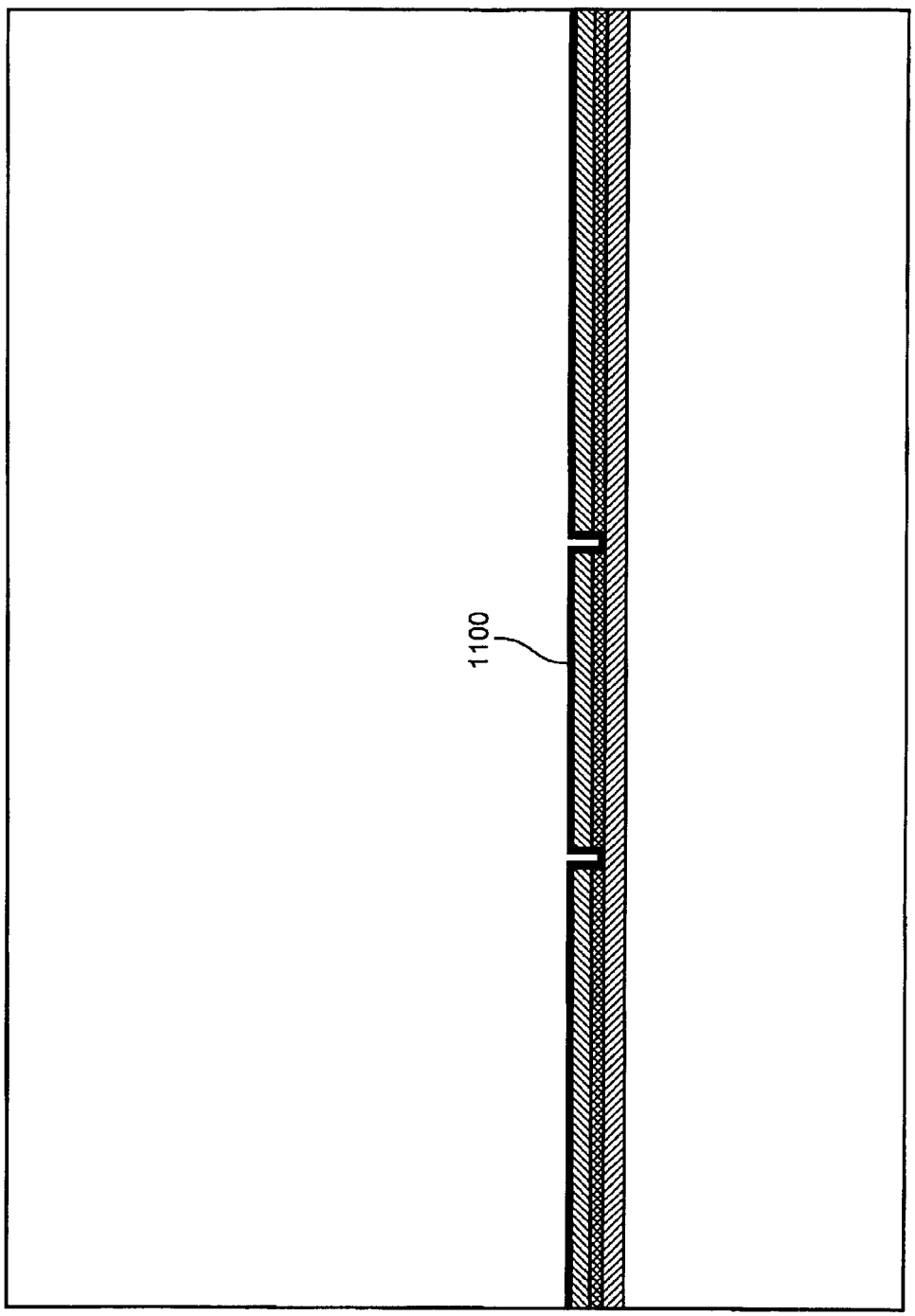
FIG. 11 is a cross-sectional view of the manufacturing process of an integrated circuit according to one embodiment of the invention.

FIG. 11 shows a deposited layer of conducting material 1100. For example, in FIG. 11 polysilicon can be used as the electrically conducting material. This polysilicon layer is deposited over the nitride layer so as to line the channels which were previously formed in FIG. 10.

Figure 12:
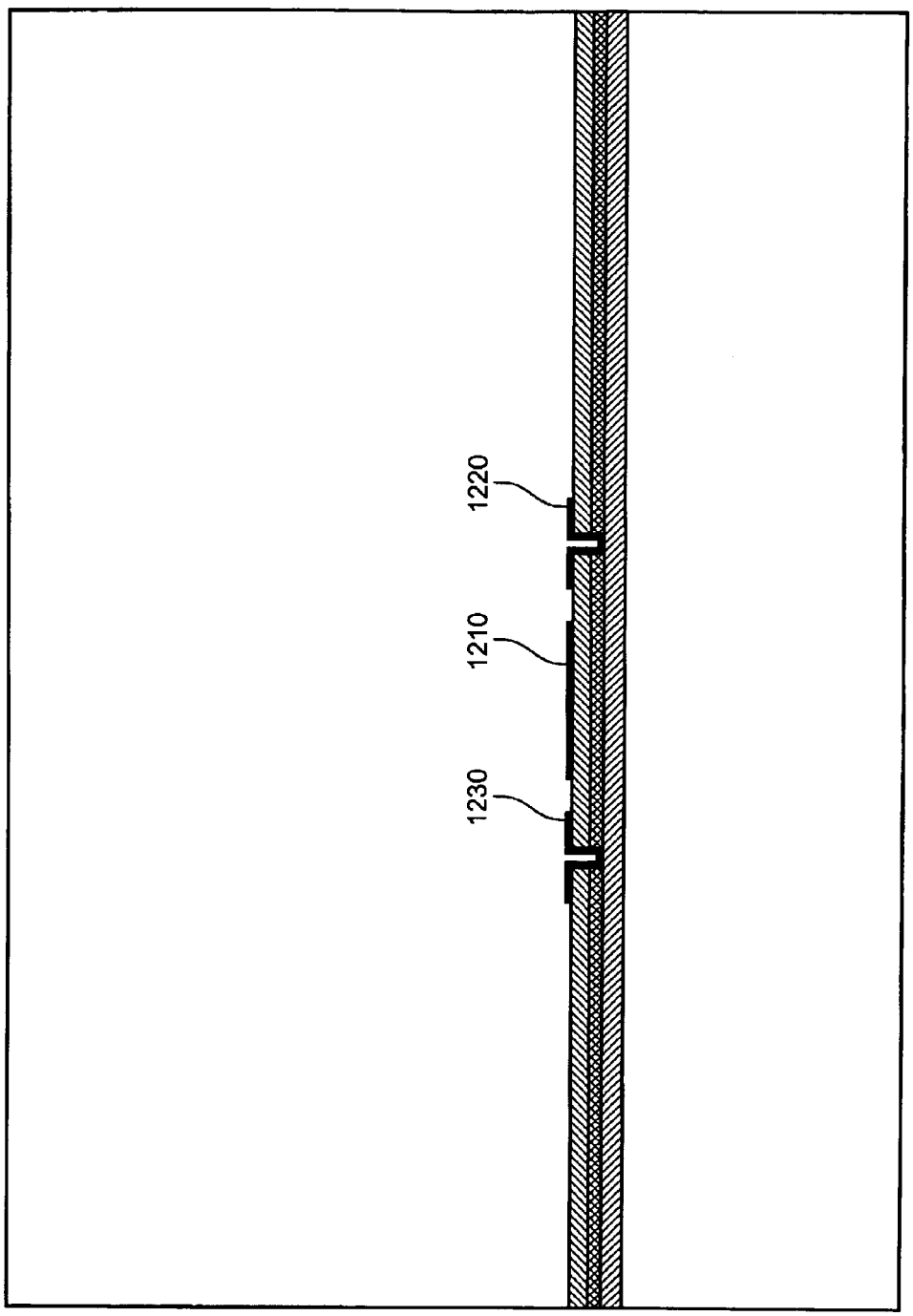
FIG. 12 is a cross-sectional view of the manufacturing process of an integrated circuit according to one embodiment of the invention.

In FIG. 12 an etching procedure can take place through the use of a mask. The mask is shown at the top of FIG. 12. This process removes the polysilicon layer leaving remnants of the polysilicon layer 1230, 1210, and 1220. Segments 1230 and 1220 serve to line the previously formed channel while remnant 1210 is configured by the mask to act at a conductor. The polysilicon deposited and etched away is commonly referred to as poly0.

Figure 13:
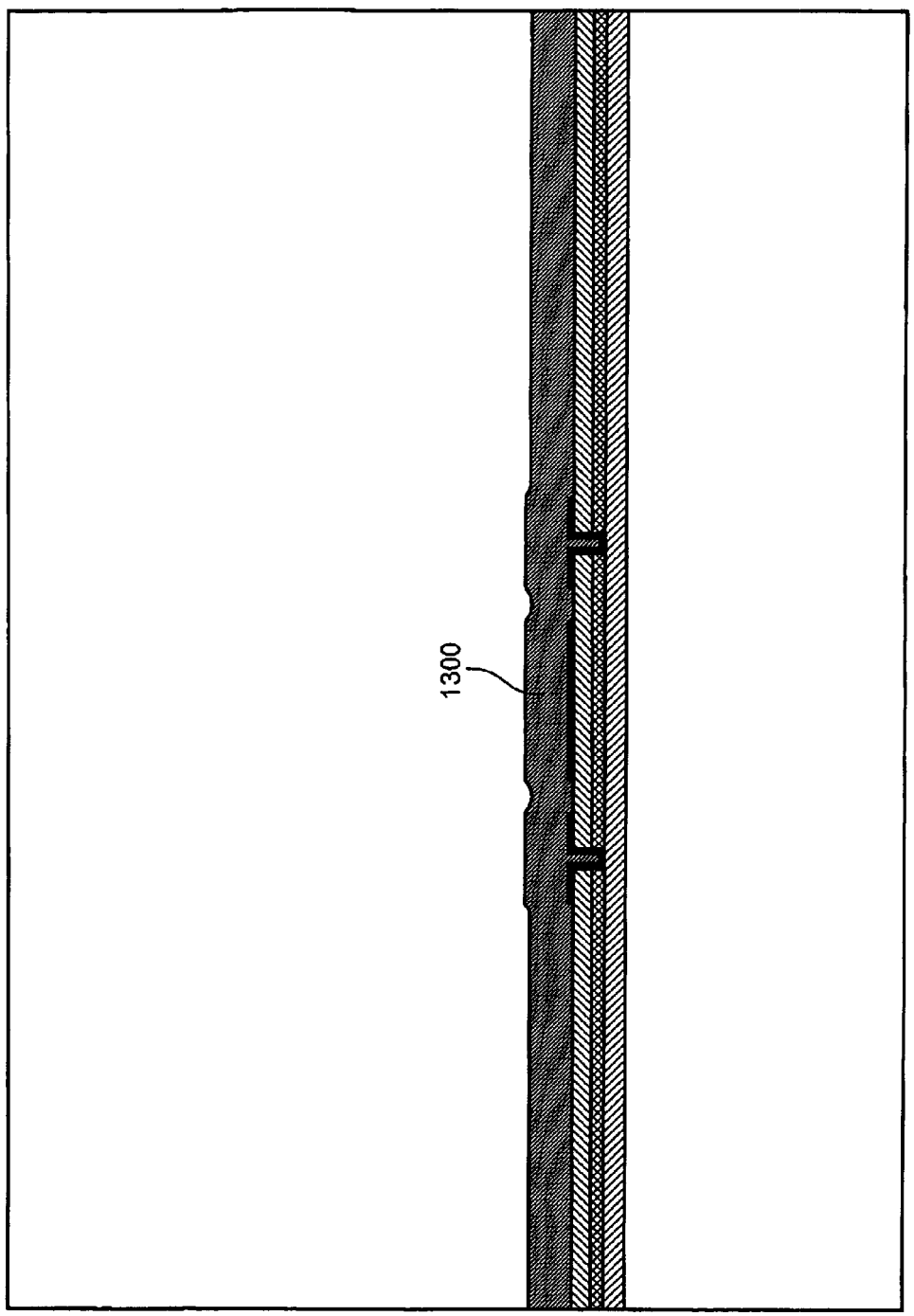
FIG. 13 is a cross-sectional view of the manufacturing process of an integrated circuit according to one embodiment of the invention.

FIG. 13 illustrates the deposition of an insulating layer 1300, e.g., silicon dioxide. The silicon dioxide layer shown in FIG. 13 serves as a sacrificial oxide layer.

Figure 14:
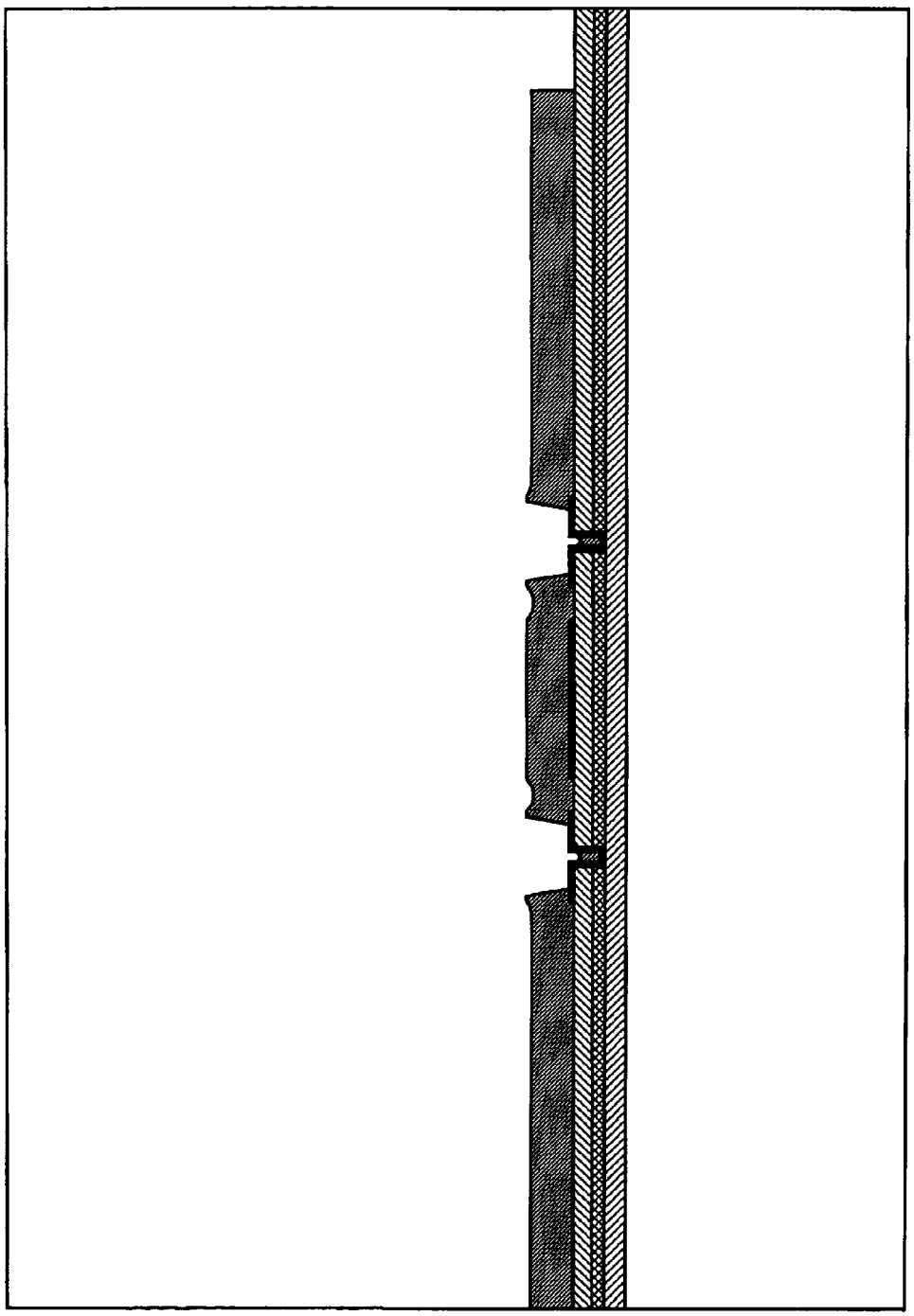
FIG. 14 is a cross-sectional view of the manufacturing process of an integrated circuit according to one embodiment of the invention.

FIG. 14 illustrates that through the use of another mask, the sacrificial oxide layer can be etched away. This is shown in FIG. 14 where the sacrificial oxide layer has been etched away immediately above the polysilicon segment, but not above the polysilicon conductor.

Figure 15:
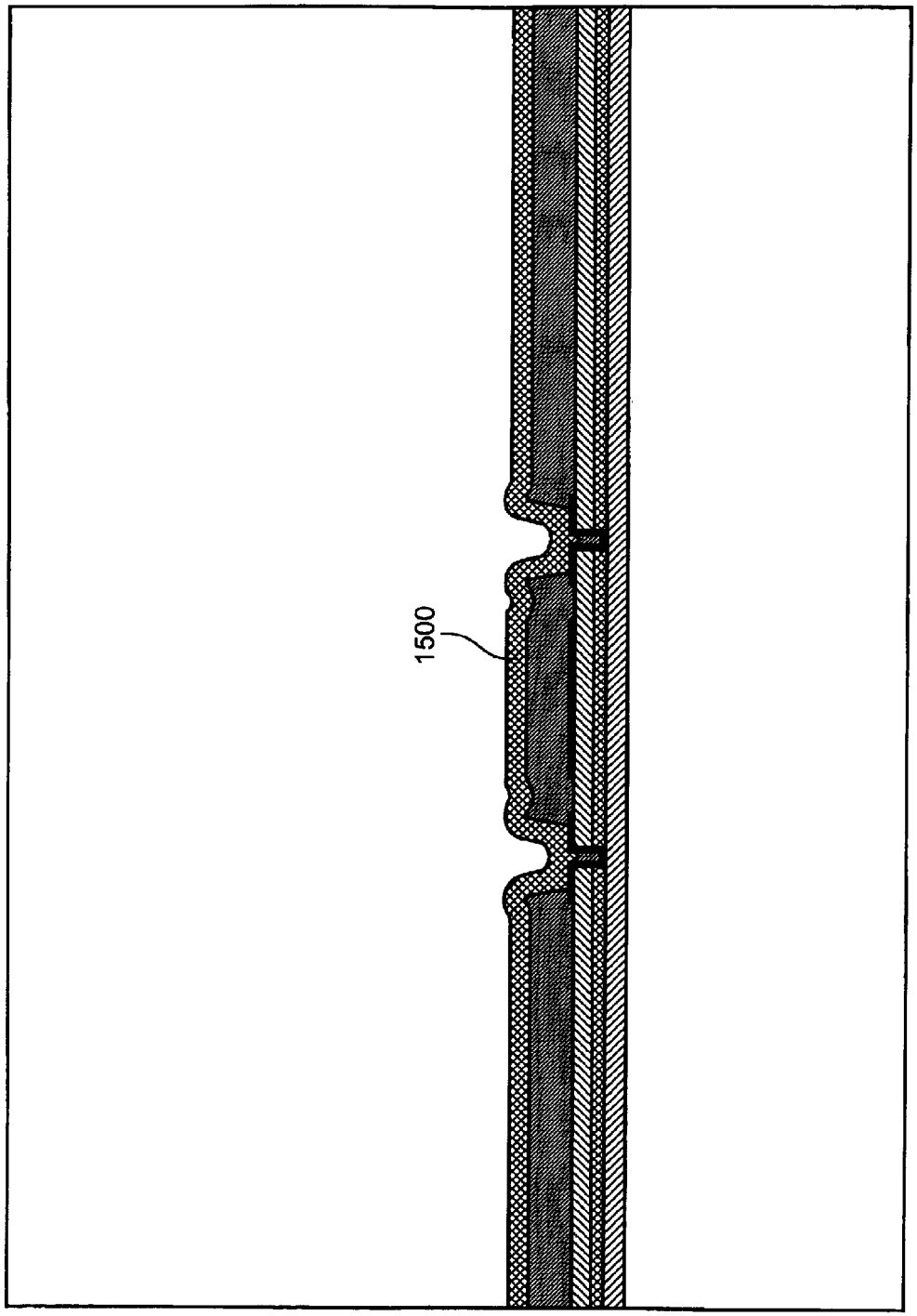
FIG. 15 is a cross-sectional view of the manufacturing process of an integrated circuit according to one embodiment of the invention.

FIG. 15 illustrates the deposition of a second polysilicon layer 1500. This polysilicon layer is deposited over the previously applied sacrificial layer in FIG. 15. The polysilicon layer is coupled to the previously deposited polysilicon layer which couples the second polysilicon layer to the silicon substrate in FIG. 15.

Figure 16:
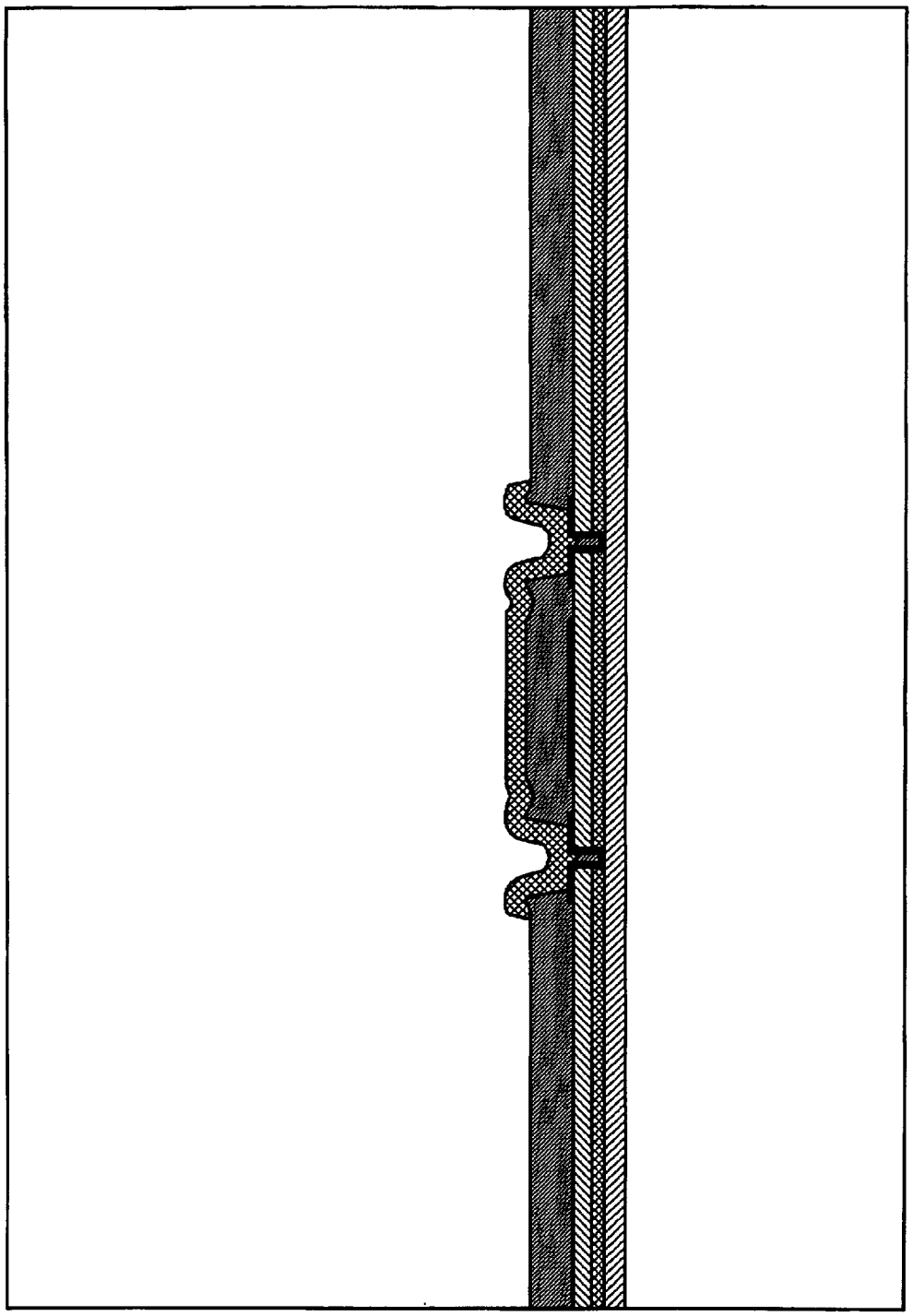
FIG. 16 is a cross-sectional view of the manufacturing process of an integrated circuit according to one embodiment of the invention.

In FIG. 16, yet another mask is used to etch away the portions of the previously applied polysilicon layer. Thus, as shown in FIG. 16, the deposited polysilicon layer is shown above the conductor, yet removed above the sacrificial oxide layer.

Figure 17:
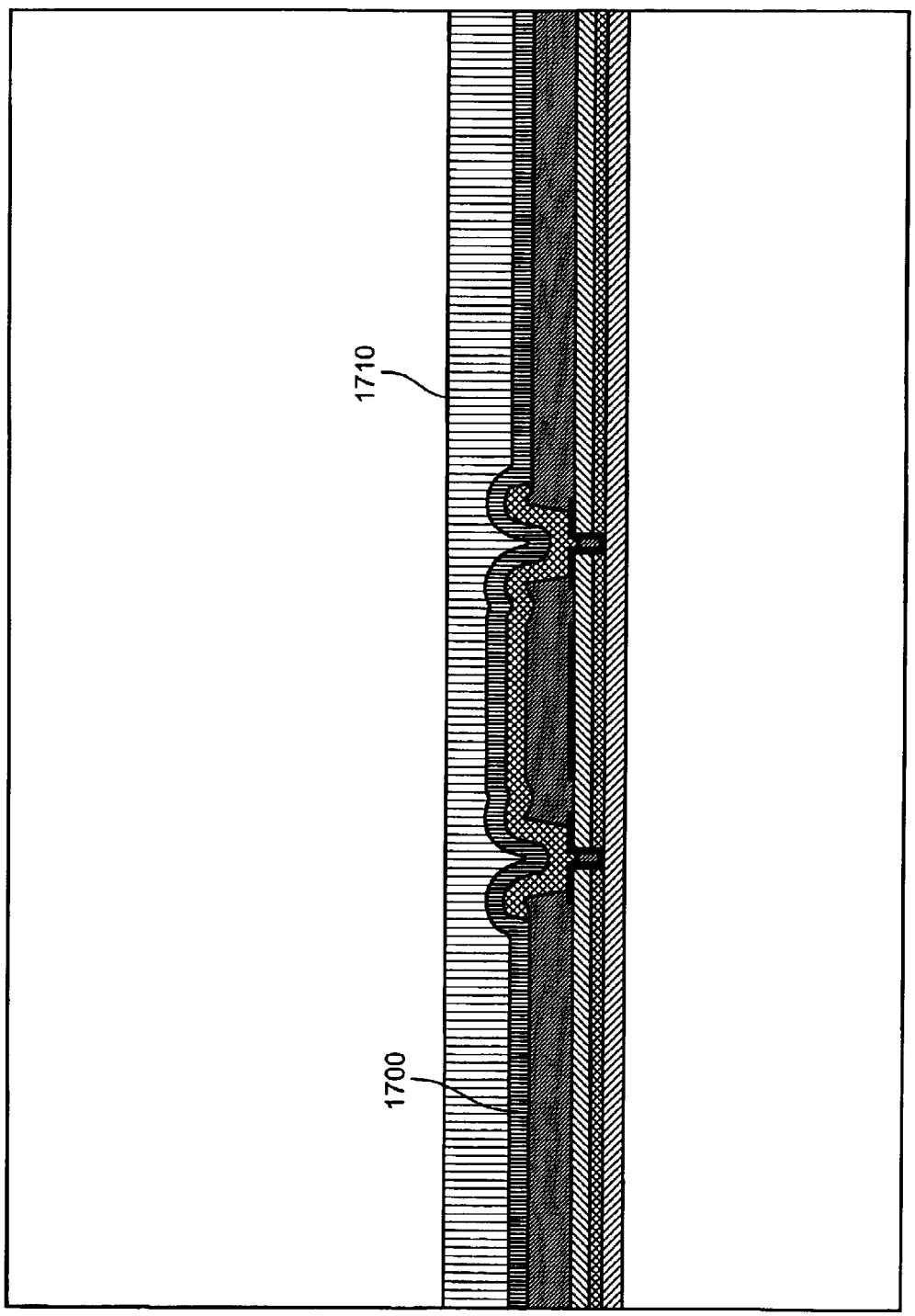
FIG. 17 is a cross-sectional view of the manufacturing process of an integrated circuit according to one embodiment of the invention.
Figure 18:
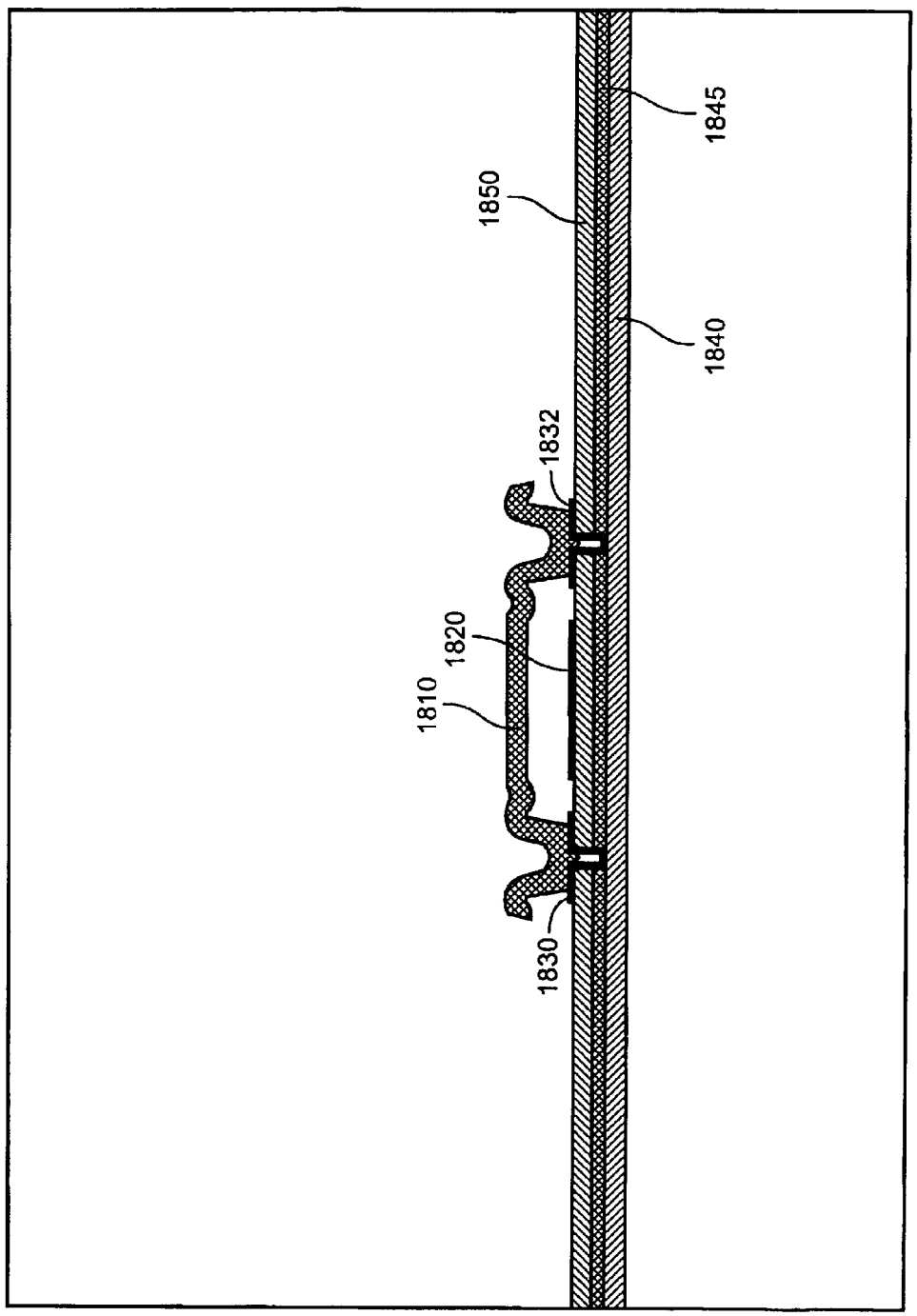
FIG. 18 is a cross-sectional view of an integrated circuit illustrating a protective barrier serving as a tunnel in protecting a conductor according to one embodiment of the invention.

In FIG. 17, two additional sacrificial oxide layers are applied. Sacrificial oxide layer 1700 is deposited first, followed by sacrificial oxide layer 1710. As can be seen in the embodiment shown in FIG. 17, the second sacrificial oxide layer 1710 is thicker than the first sacrificial oxide layer 1700. These sacrificial oxide layers can be used to orient the active mechanical component. After deposition of the sacrificial oxide layers and fabrication of other components of the circuit, these sacrificial oxide layers can be released, such as through the use of hydrofluoric acid. The use of the hydrofluoric acid removes the oxide layers of material, but does not remove the polysilicon or nitride layers. Thus, as shown in FIG. 18, the removal of the sacrificial oxide layers leaves a conductor 1820 protected by a protective covering 1810a. The substrate 1840 is covered by the oxide layer 1845 and nitride layer 1850 in FIG. 18. The protective covering 1810 is electrically coupled with the silicon substrate 1840 by the poly0 material 1830 and 1832. Thus, the fabrication process allows the formation of a conductor which is at least partially covered with a protective covering.

The protective covering can be deposited in a variety of ways, for example, it can be applied as a single layer which in view of the topology of the underlying layers can form a tunnel around a conductor. Such a tunnel is illustrated in the cross sectional view of FIG. 1. This tunnel can extend along the length of the conductor. As noted earlier, this tunnel can extend partially around the conductor, yet be electrically coupled with other electrically conductive material so as to form a ground circuit around the conductor. Thus, this ground circuit would extend for the length of the tunnel. Furthermore, it is envisioned that the protective covering could be comprised of more than one type of material.

According to one embodiment of the invention, the equipotential barrier can be manufactured by utilizing polysilicon as the material for the equipotential barrier. Furthermore, this polysilicon material can be electrically coupled with the substrate so as to form an equipotential ring. In addition, the substrate can be electrically coupled with a circuit ground, such as to a bonding pad which is coupled to the circuit ground, so as to establish a ground ring about the conductor which is being protected.

The fabrication process has been described as locating layers of material, e.g., protective covering "over" another layer of material. The word "over" is intended to mean above the referenced layer. For example, the substrate layer when the substrate is oriented on a supporting surface. However, it is not required that the two layers be succeeding layers of material. There can be intermediate layers of material between the two referenced layers. Furthermore, "equipotential ring" is understood to mean that the voltage of the ring relative to a reference voltage is substantially equal throughout the ring. It is recognized that due to the resistive properties of some materials used in the manufacture of integrated circuit devices, that the voltage will not be exactly equal throughout the entire ground ring. However, such negligible differences introduced by the materials are not considered to take such structures out of the definition of equipotential ring, as would be understood by one of ordinary skill in the art.

While various embodiments of the invention have been described as methods or apparatus for implementing the invention, it should be understood that some embodiments can be similarly implemented through code coupled to a computer, e.g., code resident on a computer or accessible by the computer. For example, software and databases could be utilized to implement many of the methods discussed above. Thus, in addition to embodiments where the invention is accomplished by hardware, it is also noted that these embodiments can be accomplished through the use of an article of manufacture comprised of a computer usable medium having a computer readable program code embodied therein, which causes the enablement of the functions disclosed in this description. Therefore, it is desired that embodiments of the invention also be considered protected by this patent in their program code means as well.

It is also noted that many of the structures, materials, and acts recited herein can be recited as means for performing a function or steps for performing a function. Therefore, it should be understood that such language is entitled to cover all such structures, materials, or acts disclosed within this specification and their equivalents.

In addition to embodiments where the invention is accomplished by hardware, it is also noted that these embodiments can be accomplished through the use of an article of manufacture comprised of a computer usable medium having a computer readable program code embodied therein, which causes the enablement of the functions and/or fabrication of the hardware disclosed in this specification. For example, this might be accomplished through the use of hardware description language (HDL), register transfer language (RTL), VERILOG, VHDL, or similar programming tools, as one of ordinary skill in the art would understand. It is therefore envisioned that the functions accomplished by the present invention as described above could be represented in a core which could be utilized in programming code and transformed to hardware as part of the production of integrated circuits. Therefore, it is desired that the embodiments expressed above also be considered protected by this patent in their program code means as well.

It is thought that the embodiments of the present invention and many of its attendant advantages will be understood from this specification and it will be apparent that various changes may be made in the form, construction, and arrangement of the parts thereof without departing from the spirit and scope of the invention or sacrificing all of its material advantages, the form herein before described being merely exemplary embodiments thereof.

What is claimed is:

1. A method of protecting a conductor in a micromachined device, said method comprising:
   providing a substrate for a micromachined device;
   providing a conductor as part of said micromachined device for use in conducting electrical signals during operation of said micromachined device;
   providing a protective covering for said conductor so that said conductor is disposed between said substrate and said protective covering and so that said protective covering is configured so as to form a tunnel relative to said conductor.

2. The method as described in claim 1 wherein said protective covering comprises polysilicon.

3. The method as described in claim 1 wherein said providing a protective covering comprises depositing said protective covering as a layer of material.

4. The method as described in claim 3 wherein said layer of material protects a plurality of conductors.

5. The method as described in claim 1 and further comprising:
   electrically coupling said protective covering with said substrate so as to configure a ground ring around said conductor.

6. The method as described in claim 1 and further comprising:
   not depositing a passivation layer over an active mechanical component of said micromachined device.

7. A method of protecting a conductor in a micromachined device, said method comprising:
   providing a micromachined device comprising a substrate;
   providing a conductor as part of said micromachined device;
   providing as part of said micromachined device a protective covering, wherein said conductor is disposed between said protective covering and said substrate of said micromachined device and wherein said protective layer of material is configured so as to form a tunnel relative to said conductor.

8. The method as described in claim 7 wherein said providing a protective covering comprises utilizing polysilicon as said protective covering.

9. The method as described in claim 7 wherein said providing said protective covering comprises depositing said protective covering as a layer of material.

10. The method as described in claim 9 wherein said layer of material protects a plurality of conductors.

11. The method as described in claim 7 and further comprising:
    electrically coupling said protective covering with said substrate so as to configure a ground ring around said conductor.

12. The method as described in claim 7 and further comprising:
    not depositing a passivation layer over an active mechanical component of said micromachined device.

13. A method of providing a micromachined apparatus, said method comprising:
    providing a substrate;
    disposing a bonding pad over said substrate;
    disposing a conductor over said substrate, wherein said conductor is electrically coupled with said bonding pad;
    disposing an active mechanical component over said substrate, wherein said active mechanical component is configured to move relative to said substrate during operation of said micromachined apparatus;
    disposing a protective cover over said conductor so that said conductor is disposed between said protective covering and said substrate and so that said protective cover is configured so as to form a tunnel relative to said conductor.

14. The method as described in claim 13 wherein said active mechanical component comprises a mirror.

15. The method as described in claim 14 wherein said mirror comprises silicon.

16. The method as described in claim 13 wherein said active mechanical component is exposed to the atmosphere during operation of said micromachined apparatus.

17. The method as described in claim 13 wherein a portion of said conductor is exposed to the atmosphere during operation of said micromachined apparatus.

18. The method as described in claim 13 wherein said protective cover comprises polysilicon.

19. The method as described in claim 13 wherein said protective cover is operable so as to protect said conductor from an electrical short when a voltage of at least 100 Volts is applied to said protective cover.

20. The method as described in claim 13 and further comprising:
    electrically coupling said protective cover with said substrate so as to configure a ground ring around said conductor.

21. The method as described in claim 13 and further comprising:
    not depositing a passivation layer over an active mechanical component of said micromachined apparatus.

22. A method of configuring a micromachined apparatus, said method comprising:
- providing a bonding pad as part of said micromachined apparatus;
- providing an active mechanical component, wherein said active mechanical component is configured to move during operation of said micromachined apparatus;
- disposing a conductor between said active mechanical component and said bonding pad;
- protecting at least a portion of said conductor disposed between said active mechanical component and said bonding pad with a protective layer of material operable to protect said conductor from electrical shorts and configured so as to form a tunnel relative to said conductor.

23. The method as described in claim 22 wherein said providing an active mechanical component comprises providing a mirror.

24. The method as described in claim 22 and further comprising configuring said active mechanical component so as to be exposed to the atmosphere during operation of said micromachined apparatus.

25. The method as described in claim 22 wherein said protective layer of material protects said conductor when a voltage of at least 100 Volts is applied to said protective layer of material.

26. The method as described in claim 22 and further comprising:
- configuring said protective layer of material so as to form at least part of a ground ring around said conductor.

27. The method as described in claim 22 and further comprising:
- not depositing a passivation layer over said active mechanical component.

28. A method comprising:
- providing a substrate;
- disposing a conductor over said substrate operable for conducting electrical signals;
- configuring an equipotential barrier at least partially around said conductor operable for protecting said conductor from electrical shorts, wherein said configuring said equipotential barrier comprises:
  - configuring a tunnel of electrically conductive material over said conductor; and
  - coupling said electrically conductive material with said substrate.

29. The method as described in claim 28 wherein said configuring an equipotential barrier comprises:
- depositing polysilicon over said conductor; and
- electrically coupling said polysilicon with said substrate so as to form an equipotential ring.

30. The method as described in claim 29 and further comprising:
- electrically coupling said equipotential ring to a circuit ground.

31. The method as described in claim 28 and further comprising:
- electrically coupling said equipotential barrier to a circuit ground.

32. A method of protecting a conductor in a micromachined device, said method comprising:
- providing a substrate for a micromachined device;
- providing a conductor as part of said micromachined device for use in conducting electrical signals during operation of said micromachined device;
- providing a protective covering for said conductor so that said conductor is disposed between said substrate and said protective covering;
- electrically coupling said protective covering with said substrate so as to configure a ground ring around said conductor.

33. The method as described in claim 32 wherein said protective covering comprises polysilicon.

34. The method as described in claim 32 wherein said providing a protective covering comprises depositing said protective covering as a layer of material.

35. The method as described in claim 34 wherein said layer of material protects a plurality of conductors.

36. The method as described in claim 32 and further comprising:
- not depositing a passivation layer over an active mechanical component of said micromachined device.

37. A method of providing a micromachined apparatus, said method comprising:
- providing a substrate;
- disposing a bonding pad over said substrate;
- disposing a conductor over said substrate, wherein said conductor is electrically coupled with said bonding pad;
- disposing an active mechanical component over said substrate, wherein said active mechanical component is configured to move relative to said substrate during operation of said micromachined apparatus;
- disposing a protective cover over said conductor so that said conductor is disposed between said protective covering and said substrate;
- electrically coupling said protective cover with said substrate so as to configure a ground ring around said conductor.

38. The method as described in claim 37 wherein said active mechanical component comprises a mirror.

39. The method as described in claim 38 wherein said mirror comprises silicon.

40. The method as described in claim 37 wherein said active mechanical component is exposed to the atmosphere during operation of said micromachined apparatus.

41. The method as described in claim 37 wherein a portion of said conductor is exposed to the atmosphere during operation of said micromachined apparatus.

42. The method as described in claim 37 wherein said protective cover comprises polysilicon.

43. The method as described in claim 37 wherein said protective cover is operable so as to protect said conductor from an electrical short when a voltage of at least 100 Volts is applied to said protective cover.

44. The method as described in claim 37 and further comprising:
- not depositing a passivation layer over an active mechanical component of said micromachined apparatus.

45. A method of configuring a micromachined apparatus, said method comprising:
- providing a bonding pad as part of said micromachined apparatus;
- providing an active mechanical component, wherein said active mechanical component is configured to move during operation of said micromachined apparatus;
- disposing a conductor between said active mechanical component and said bonding pad;
- protecting at least a portion of said conductor disposed between said active mechanical component and said bonding pad with a protective layer of material operable to protect said conductor from electrical shorts;

configuring said protective layer of material so as to form at least part of a ground ring around said conductor.

46. The method as described in claim 45 wherein said providing an active mechanical component comprises providing a mirror.

47. The method as described in claim 45 and further comprising configuring said active mechanical component so as to be exposed to the atmosphere during operation of said micromachined apparatus.

48. The method as described in claim 45 wherein said protective layer of material protects said conductor when a voltage of at least 100 Volts is applied to said protective layer of material.

49. The method as described in claim 45 and further comprising:

not depositing a passivation layer over said active mechanical component.

* * * * *